US008723506B2

(12) United States Patent
Ramirez

(10) Patent No.: US 8,723,506 B2
(45) Date of Patent: May 13, 2014

(54) UTILITY METER WITH CAPACITOR CHARGING CIRCUIT RESPONSIVE TO A REGULATED DC VOLTAGE

(75) Inventor: Anibal Diego Ramirez, Indianapolis, IN (US)

(73) Assignee: Landis+Gyr, Inc., Lafayette, IN (US)

( * ) Notice: Subject to any disclaimer, the term of this patent is extended or adjusted under 35 U.S.C. 154(b) by 238 days.

(21) Appl. No.: 13/187,864

(22) Filed: Jul. 21, 2011

(65) Prior Publication Data

US 2013/0021021 A1    Jan. 24, 2013

(51) Int. Cl.
*G01R 7/00* (2006.01)
(52) U.S. Cl.
USPC ........... 324/142; 324/113; 324/120; 324/140; 340/693.2; 340/870.02; 361/659
(58) Field of Classification Search
USPC ................. 324/142, 134, 113, 119, 120, 157; 340/870.02, 693.2; 361/661, 659–672
See application file for complete search history.

(56) References Cited

U.S. PATENT DOCUMENTS

| 4,999,575 | A | * | 3/1991 | Germer | 324/142 |
| 6,496,939 | B2 | * | 12/2002 | Portman et al. | 713/340 |
| 7,348,769 | B2 | | 3/2008 | Ramirez | |
| 7,684,768 | B1 | * | 3/2010 | Fest et al. | 455/91 |
| 2004/0061624 | A1 | * | 4/2004 | Villicana et al. | 340/870.02 |
| 2006/0066456 | A1 | * | 3/2006 | Jonker et al. | 340/870.02 |
| 2006/0158177 | A1 | * | 7/2006 | Ramirez | 324/142 |
| 2011/0242715 | A1 | * | 10/2011 | Voisine et al. | 361/65 |

* cited by examiner

*Primary Examiner* — Patrick J Assouad
*Assistant Examiner* — Alexander J Nemtzow
(74) *Attorney, Agent, or Firm* — Maginot, Moore & Beck

(57) ABSTRACT

A capacitor charging circuit is provided in a utility meter. The utility meter includes a measurement circuit configured to provide consumption data, a memory configured to store the consumption data from the measurement circuit, and a communications device configured to transmit the consumption data to a remote location. The utility meter also includes a power supply configured to supply an unregulated DC voltage and a regulated voltage within the utility meter. The regulated DC voltage is output from a voltage regulator and is provided to the measurement circuit. The unregulated DC voltage is supplied to the communications device. The capacitor charging circuit is configured to charge a capacitor with the unregulated DC voltage when the regulated DC voltage is provided to the charging circuit from the voltage regulator. The capacitor charging circuit may be a supercapacitor charging circuit.

20 Claims, 2 Drawing Sheets

UTILITY METER WITH CAPACITOR CHARGING CIRCUIT RESPONSIVE TO A REGULATED DC VOLTAGE

FIELD

This application relates to the field utility meters and more particularly to the charging of capacitors in utility meters.

BACKGROUND

Utilities, including electrical, water and gas utilities monitor consumption by customers through meters. In particular, electrical utilities monitor electrical energy consumption, water utilities monitor water consumption, and gas utilities monitor gas consumption. Utilities use the consumption information primarily for billing, but also for resource allocation planning and other purposes.

Modern utility meters typically include numerous solid state electronics components and associated electronic devices including sensor devices, data processors, microcontrollers, memory devices, clocks, and communications devices. These electronic devices are used for various purposes within the meter, including usage detection, consumption calculation, data storage, and communications. In association with these electronic devices, the utility meters also include a power supply configured to provide DC power to the electronic devices.

A typical onboard power supply utilized in electricity meters is a wide range switching power supply. A single wide range switching power supply may supply the power for both the data acquisition hardware and the communications hardware. Switching power supplies store DC energy in capacitors. The DC energy stored in the capacitors is typically used to sustain the operation of the meter for some limited amount of time in the event of a power-down event. For example, some capacitors associated with the switching power supply may be configured to provide DC power to the microcontroller until the non-volatile memory write cycle is completed (approx. 400 mS) during power outages. The power provided from the capacitor for this short amount of time allows for the recording of energy consumption data which would otherwise be lost in the event of a power outage.

Another example of a capacitor sometimes associated with the power supply is an electric double-layer capacitor (i.e., a "super capacitor") used to provide DC power to the real time clock in the absence of a lithium battery. Super capacitors are characterized by long life and a high energy density. In the event of a power outage in the electricity meter, the super capacitor is configured to provide DC power to the real time clock for a relatively long period of time (e.g., thirty six hours to seventy two hours or more). By supplying power to the real time clock during a power outage, the electricity meter maintains the proper time even if power is not restored to the meter for several hours or days.

Super capacitors used in electricity meters are normally charged off the regulated voltage of the power supply using a simple current limiting resistor without any circuit delays. In order to minimize the burden on the DC power supply, the current available to charge the super capacitor is typically limited down to a few milliamps at the expense of long charge times (e.g., in the order of 10 to 15 minutes). However, longer charge times mean that the super capacitor may not fully charge following power-up if a power outage occurs. Long charge times also impose a significant burden on the meter manufacturing/programming/testing when the supercap charging circuit needs to be verified. For instance during the electronics assembly process each functional block needs to be exercised which means that a significant delay will be introduced at low charging currents to verify the correct operation of the charging circuit. Thus, a need exists for a utility meter configured to economically facilitate rapid charge times for the super capacitor without imposing a significant burden on the power supply.

SUMMARY

In accordance with one embodiment of the disclosure, there is provided a utility meter including a capacitor charging circuit. The utility meter includes a measurement circuit configured to provide consumption data, a memory configured to store the consumption data from the measurement circuit, and a communications device configured to transmit the consumption data to a remote location. The utility meter also includes a power supply configured to supply an unregulated DC voltage and a regulated voltage within the utility meter. The regulated DC voltage is output from a voltage regulator and is provided to the measurement circuit. The unregulated DC voltage is supplied to the communications device. The capacitor charging circuit is configured to charge a capacitor with the unregulated DC voltage when the regulated DC voltage is provided to the charging circuit from the voltage regulator. The capacitor may be a supercapacitor such that charging circuit is a supercapacitor charging circuit.

Pursuant to another embodiment of the disclosure, an electricity meter is provided with a capacitor charging circuit. The electricity meter includes a measurement circuit configured to be coupled to a power line, the measurement circuit including a current sensor and a voltage sensor. The electricity meter also includes a memory coupled to the measurement circuit and a power supply. The memory is configured to receive data from the measurement circuit. The power supply is configured to be coupled to the power line and supply an unregulated DC voltage and a regulated voltage within the electricity meter. The regulated DC voltage is output from a voltage regulator and is provided to the measurement circuit. The capacitor charging circuit is coupled to the voltage regulator and is configured to charge a capacitor with the unregulated DC voltage supplied from the voltage regulator.

According to yet another embodiment of the disclosure, the supercapacitor charging circuit provides for a method of charging a supercapacitor in an electricity meter. The method includes blocking the supercapacitor from charging before a voltage regulator reaches a minimum operating voltage, wherein voltage regulator is configured to supply a regulated DC voltage in the electricity meter. The method further includes charging the supercapacitor with an unregulated DC voltage after the voltage regulator reaches a minimum operating voltage.

The above described features and advantages, as well as others, will become more readily apparent to those of ordinary skill in the art by reference to the following detailed description and accompanying drawings. While it would be desirable to provide a utility meter that provides one or more of these or other advantageous features, the teachings disclosed herein extend to those embodiments which fall within the scope of the appended claims, regardless of whether they accomplish one or more of the above-mentioned advantages.

DESCRIPTION

Figure 1:
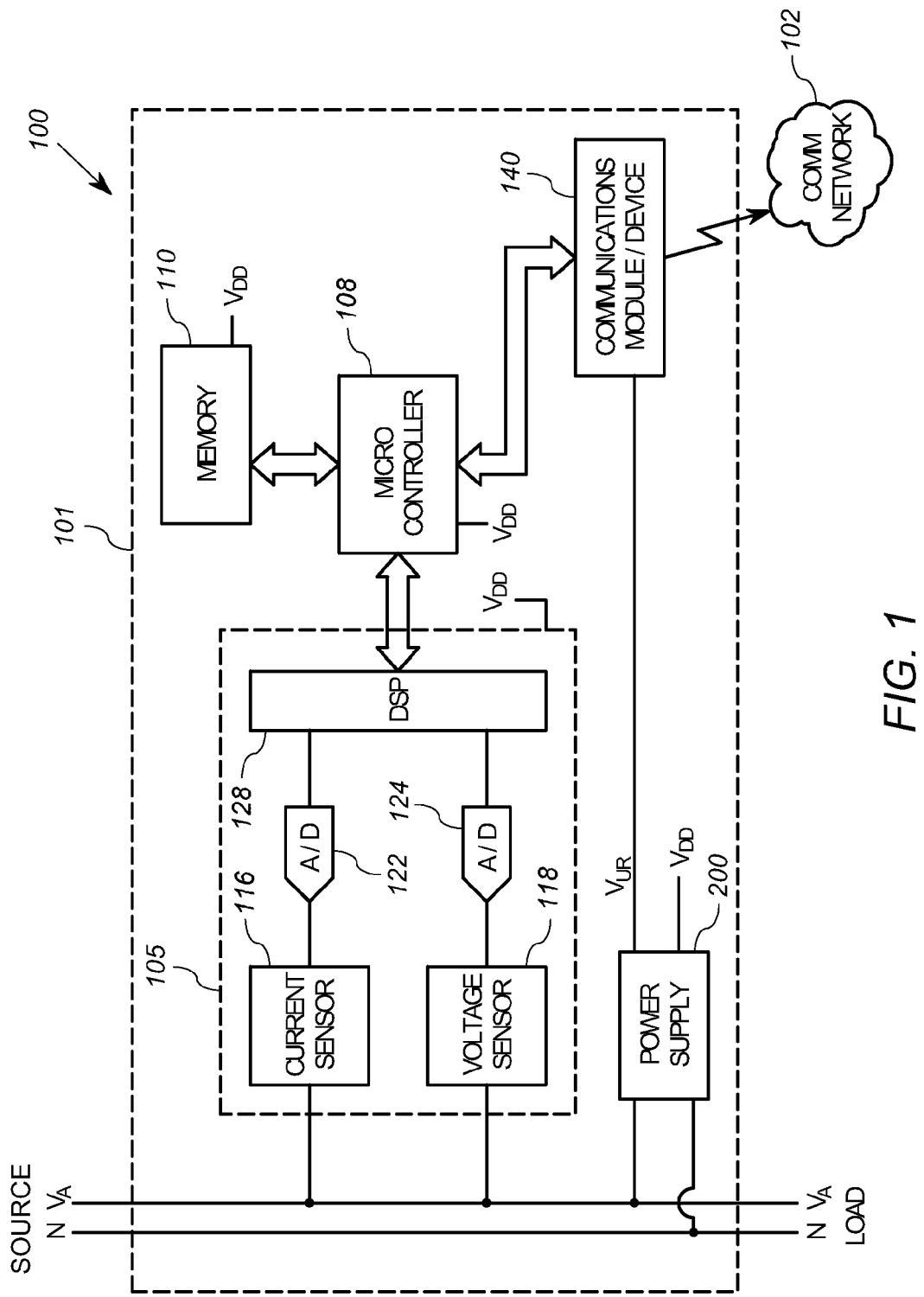
FIG. 1 shows a block diagram of an exemplary utility meter including a measurement circuit, a microprocessor, a memory, a communications module, and a power supply.

With reference to FIG. 1, an exemplary utility meter is shown in the form of an electricity meter 100. The electricity meter 100 is configured to measure power consumption by a load. The exemplary meter 100 includes a measurement circuit 105, a processor/microcontroller 108, a memory circuit 110, a communication module/device 140, and a power supply 200. The utility meter is configured to measure electrical power delivered on a power line $V_A$ from a source (i.e. the utility) to a load (i.e., the customer). It will be noted that the single-phase electricity meter 100 is given by way of example only in FIG. 1. It will be recognized that those of ordinary skill in the art may readily adapt the inventive aspects of the disclosed embodiment to other types of meters, such as three phase electricity meters or other types of utility meters.

As shown in FIG. 1, the measurement circuit 105 includes a current sensor 116, a voltage sensor 118, a first analog-to-digital ("A/D") converter 122, a second A/D converter 124, and digital signal processor 128. The current sensor 116 is coupled to the power line $V_A$ and configured to receive signals indicative of the current flowing through the power line. To this end, the current sensor 116 of the exemplary embodiment described herein may include a transformer situated to detect current on the power line. The voltage sensor 118 is coupled to the power line $V_A$ and configured to obtain a voltage measurement therefrom. To this end, the voltage sensor 118 may suitably comprise a high resistance voltage divider. Alternatively, the voltage sensors 118 may be a potential transformer. Analog signals from the current sensor 116 and the voltage sensor are delivered to the A/D converters 122 and 124, where the signals are converted into digital signals and passed onto the digital signal processor 128. The digital signal processor 128 (which may also be referred to herein as "metering IC") generates digital signals that are delivered to the micropro-cessor/controller 108. These digital signals provide consumer consumption data and other data to the microprocessor 108. For example, the digital signals from the digital signal processor 128 to the controller may include power consumption, voltage and current signals.

The controller 108 is operably configured to execute programming instructions, receive the digital signals from the measurement circuit 105, monitor and record power consumption using the digital signals, and analyze the digital voltage and current measurement signals and associated phase angle data to determine whether one or more measurement errors is present. The controller 108 generally includes firmware, or in other words, an integrated memory into which programming instructions are stored. Alternatively, the programming instructions may be stored in the memory 110. In the embodiment of FIG. 1, the measurement circuit 105 and the controller 108 are shown as distinct components, but it will be recognized by those of skill in the art that the controller 108 may be considered part of the measurement circuit 105. Also, the digital signal processor 128 may be provided as part of the microcontroller 108 or on a single integrated circuit board with the microcontroller 108.

The memory 110 is configured to store data, and the controller 108 is configured to deliver data to the memory or retrieve data from the memory 110. Accordingly, software routines for the controller 108, metrology data, and other data that may be useful for the meter 100 may be stored in the memory 100. The memory may be provided using any of various known devices such as a flash memory or other non-volatile memory.

The communications module 140 may be provided internal or external to the meter housing 101. The communications module 140 provides for communication of the consumer consumption data and other data between the meter and another entity external to or remote from the meter, such as a communications network 102. For example, in at least one embodiment, the communications module 140 may be an automatic meter reading (AMR) board and the communications network 102 may be an AMR network. In this case, communications between the communications module 140 and the communications network 102 are provided by wireless communications according to a network protocol having a predefined baud rate, data word length, stop bits, etc. The communications module 140 may include a plurality of different communications devices, such as a transceiver circuit including a wireless transmitter, wireless receiver and one or more A/D converters. The transceiver circuit may be configured to receive a signal from an external entity, such as AMR communications network 102, and deliver the received signal to the processor 108. The transceiver circuit is also configured to transmit a signal received from the processor 108 to the external entity, such as AMR communications network 102. The transceiver may include, for example, an RF transceiver operable to perform the above-described functions. However, it will be recognized that numerous other transceivers may be utilized, such as transceivers for power line communications, phone line communications, or other types of communications used in the art.

The meter 100 further includes a power supply 200 that is configured to generate bias power for the measurement circuit 105, the controller 108, the memory circuit 110, and any other elements of the meter 100 requiring DC power. Such a power supply 200 may suitably be a switched mode power supply circuit that converts line voltage received from the electrical power lines to suitable DC voltages. The DC voltages may include an unregulated DC voltage $V_{UR}$ as well as a regulated DC voltage $V_{DD}$ provided by a voltage regulator. Such power supply circuits are known to those of ordinary skill in the art. The regulated DC voltage $V_{DD}$ is used to supply DC bias voltages for the microcontroller 108, memory 110, and components of the measurement circuit 105. The unregulated DC voltage $V_{UR}$ supplies power to the communications module 140.

Figure 2:
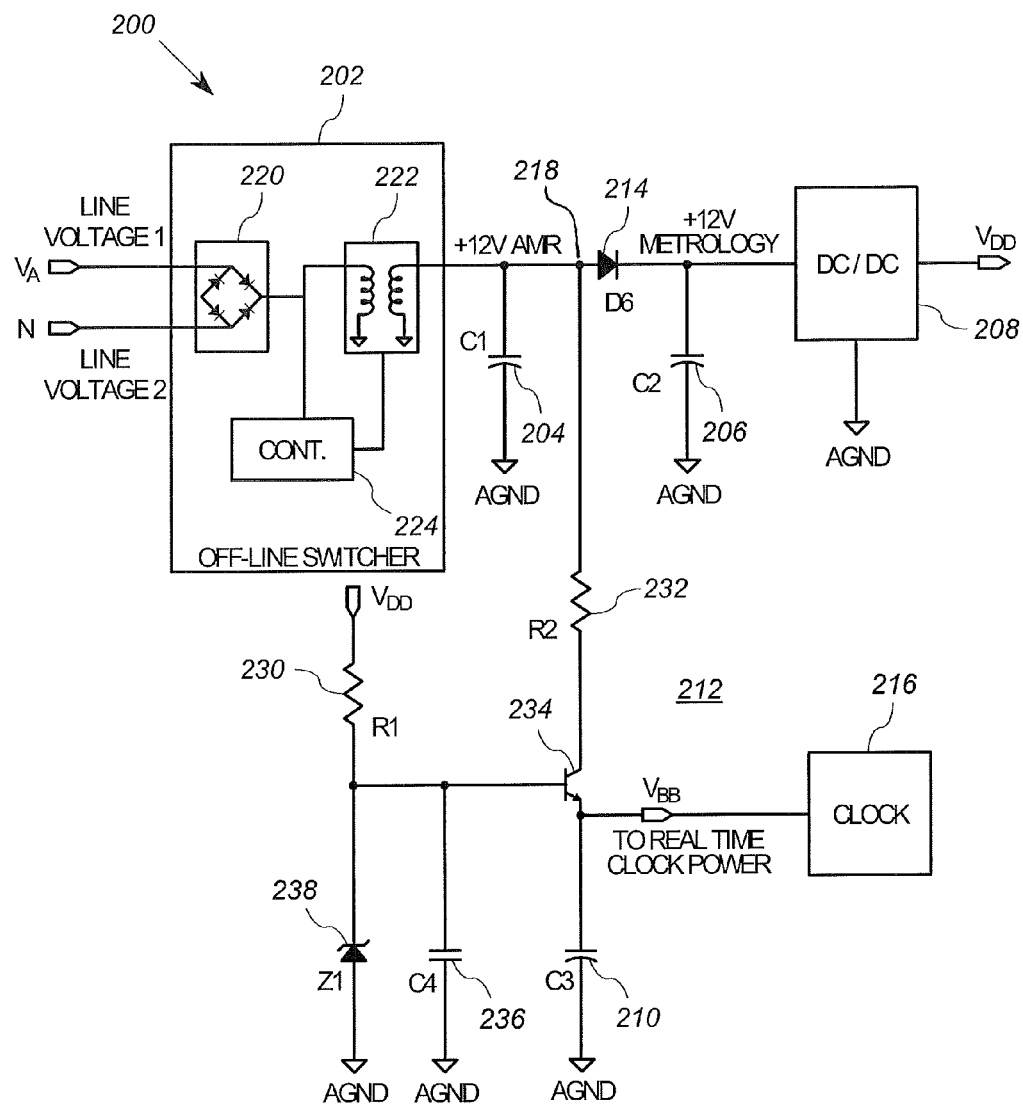
FIG. 2 shows a schematic of a supercapacitor charging circuit for use in association with the power supply of FIG. 1.

With reference now to FIG. 2, an exemplary power supply 200 is shown in association with an exemplary super capacitor charging circuit 212 configured for use within the utility meter 100. The power supply 200 includes an off line switcher 202, a first hold-up capacitor 204, a second hold-up capacitor 206, a DC voltage regulator 208. The power supply 200 is coupled to a supercapacitor 210 through the supercapacitor charging circuit 212. In the embodiment disclosed herein the power supply 200 is considered to include the first hold-up capacitor 204, second hold-up capacitor 206, and the DC voltage regulator 208, however, it will be recognized that these components may also be considered to be separate from the power supply 200.

The off line switcher 202 of the power supply 200 includes a rectifier 220, a transformer 222, and a switcher controller 224. The illustrated rectifier 220 is a full wave bridge rectifier that inverts the negative portion of the line signal. Switcher controller 224 limits the amplitude of the rectified signal by pulsing on and off to limit the amplitude of the rectified signal. This rectified amplitude limited line signal then passes through the primary coil of transformer 222. A scaled rectified amplitude limited signal is present on the secondary coil of transformer 222. The first hold-up capacitor 204 coupled across the terminals of the secondary coil of the transformer 42 is charged by the scaled rectified amplitude limited voltage signal to provide an unregulated voltage $V_{UR}$ across the terminals of the capacitor 204. In the exemplary embodiment of FIG. 2, the first hold-up capacitor is a 4700 μF capacitor, and the second hold-up capacitor is a 3300 μF capacitor.

The second hold-up capacitor 206 and a diode 214 are in parallel with the first hold-up capacitor 204 between node 218 and ground. The diode 214 blocks any current from passing in the diode's reverse direction back to node 218 from the second hold-up capacitor 206 in the event of a power outage. Unregulated voltage $V_{UR}$ is regulated by the voltage regulator 208 which provides a regulated DC signal $V_{DD}$ for powering various electronic devices in the meter 100, including the measuring circuit 105, microcontroller 108, and memory 110.

In the exemplary embodiment of FIG. 2, the unregulated voltage $V_{UR}$ is +12V. The unregulated voltage $V_{UR}$ provided across the first hold-up capacitor 204 is configured to power radios and any other communications devices associated with the communications module 140 of the meter 100. The power supply 200 of FIG. 12 is also configured such that the unregulated voltage $V_{UR}$ is provided to the supercapacitor charging circuit 212 in order to charge the supercapacitor 210, as explained in further detail below.

The supercapacitor charging circuit 212 includes a first resistor 230, a second resistor 232, a transistor 234, a coupling capacitor 236, and a zener diode 238. In the embodiment of FIG. 2, the transistor 234 is an npn-type bipolar junction transistor, but it will be recognized that other types of transistors may be used in other embodiments. The second resistor 232 is coupled to the collector of the transistor 234, and the emitter of the transistor 234 is coupled to the supercapacitor 210. The first resistor 232 is coupled to the base of the transistor 234 along with the zener diode 238 and the coupling capacitor 236. The regulated voltage $V_{DD}$ is supplied to the first resistor 232. This voltage is used to switch the transistor on and off (i.e., switch the transistor 234 between an "on state" when $V_{DD}$ is present and an "off state" when $V_{DD}$ is not present). The voltage across the supercapacitor 210 is shown as $V_{BB}$ in FIG. 2, and this voltage supplies power to a real time clock 216. In the exemplary embodiment of FIG. 2, the supercapacitor is a 0.22 F capacitor, the coupling capacitor is a 330 pF capacitor, the first resistor 232 is a 10K ohm resistor, and the second resistor is a 100 ohm resistor.

Operation of the power supply 200 and supercapacitor charging circuit 212 is now described starting with initial meter power-up. During initial meter power up, the off-line switcher 202 starts charging the first hold-up capacitor 204 and the second hold-up capacitor 206 with the unregulated DC voltage $V_{UR}$. At initial meter power-up the super capacitor charging circuit 212 is disabled. In particular, until the regulated DC voltage from the voltage regulator 208 reaches a minimum operating voltage, $V_{DD}$ is not supplied to the first resistor 230, and the voltage across the base-emitter junction of the transistor 234 is insufficient to switch the transistor 234 on. For example, in one embodiment associated with FIG. 2, the minimum +12V METROLOGY voltage required for the voltage regulator 208 during an initial power up is 10.5 VDC. This value is set by a resistor divider associated with the voltage regulator 208. With the transistor 234 switched off, charging of the supercapacitor 210 is blocked. During this time, unregulated voltage $V_{UR}$ is provided to the communications module 140, but the regulated DC voltage $V_{DD}$ is not yet supplied to the measuring circuit 105, microcontroller 108, memory 110, and other solid state electronic devices, since the voltage regulator 208 has not reached the minimum operating voltage (which is a programmable threshold voltage). Thus, it will be recognized that high DC output power provided by $V_{UR}$ is supplied to the communications module 140 during initial power up, even though this high DC output power is generally unused during initial power up as data is not typically transmitted from the communications module 140 during initial power up (e.g., no AMR transmission during initial power up).

Once the voltage regulator 208 reaches its minimum operating voltage at meter power-up, the voltage regulator 208 starts regulating its output voltage, $V_{DD}$. At this time, $V_{DD}$ is applied to the first resistor 230, switching the transistor 234 on. The super capacitor 210 then begins to charge off the unregulated voltage $V_{UR}$ voltage until it reaches its full charge ($V_{supercapacitor} = V_{zener} - V_{BE} = 3.6$ V DC). Thus, it will be recognized that the supercapacitor charging circuit 212 makes use the high DC output power from $V_{UR}$ that is otherwise unused by the meter during initial power up, but is generally designed in to sustain the normal operation of the communications module 140 and related communication devices. Moreover, it will be recognized that the super capacitor charging circuit 212 does not load the off-line switcher 202 voltage output until unregulated $V_{UR}$ output and the regulated $V_{DD}$ output have reached their nominal voltages. This helps the meter 100 avoid start up problems with the off line switcher 202 during power up.

The charge time of the supercapacitor 210 is controlled by adjusting the value of the second resistor 232 in the supercapacitor charging circuit 212. In particular, increasing the resistance of the second resistor 232 will lengthen the charging time, and decreasing the resistance of the second resistor 232 will shorten the charging time. In the embodiment of FIG. 2, the second resistor 232 has a value of about 100 ohms. This provides for a charging time of less than one minute, and particularly a charging time of about 15 to 20 seconds. This charge time is significantly shorter than the traditional charge time of 10-15 minutes for charging a supercapacitor configured to provide power to a real time clock, as typically seen with more conventional meters.

During normal meter operation following meter power-up, AC voltage is present on the power line $V_A$, and the voltage regulator 208 has reached the minimum operating voltage. With AC voltage is present on the power line $V_A$, the off-line switcher 202 of the power supply 200 provides DC power at node 218 and charges the two holdup capacitors 204 and 206 with the unregulated DC voltage $V_{UR}$. The DC voltage across the second holdup capacitor 206 is used by the DC regulator 208 to provide the appropriate regulated voltage $V_{DD}$ for the metering IC 128, micro-controller 108, memory 110, and other solid state electronics devices. $V_{DD}$ is also provided to the first resistor 230, placing the transistor 234 of the supercapacitor charging circuit 212 in an open state. At the same time, the DC voltage $V_{UR}$ across the first holdup capacitor 204 provides DC voltage for use by the communications module 140 and any other communication devices, as well as the proposed super capacitor charging circuit 212. With the transistor 234 of the supercapacitor charging circuit in an on state, the supercapacitor 210 is charged by the unregulated voltage $V_{UR}$. The voltage across the supercapacitor 210 delivers power to the real time clock 216 of the meter 100.

In a power down situation, such as a power blackout, AC voltage is not present on the power line $V_A$, and the meter is deprived of both the regulated voltage $V_{DD}$ and the unregulated voltage $V_{UR}$. When this occurs, the DC energy stored in the second hold-up capacitor 206 is used to sustain operation of the microcontroller 108 until the write cycle of the non-volatile memory 110 is completed (e.g., approx 250 ms). Similarly, the DC energy stored in the first hold-up capacitor is used to allow the communications module 140 to transmit the most recent power consumption information. The discharge time of the first holdup capacitor 204 depends on the particular radio operating current consumption. As an example, a 1 Watt radio may deplete the energy stored in the capacitor 204 in about 300 milliseconds.

When the energy in the second holdup capacitor 206 is insufficient to provide $V_{DD}$ to the capacitor charging circuit 212, the transistor 234 is switched to an off state. This ends charging of the supercapacitor 210, and the supercapacitor 210 begins providing power to the real time clock 216. While the first hold-up capacitor 204 and the second hold-up capacitor 206 power components for a relatively short time, the supercapacitor 110 powers the real time clock 216 for a relatively long period of time. For example, the supercapacitor 110 may continue to provide DC power to the real time clock 216 for many hours (e.g., 36-72 hours).

As described above, the super capacitor charging circuit 212 described herein provides very short charge times for the supercapacitor 210 without burdening the regulated power supply. Additionally, the supercapacitor charging circuit 212 uses excess DC power capacity (i.e., $V_{UR}$) which is used to provide power for communications devices (e.g., AMR devices) but is not used during the initial super capacitor charge time.

The foregoing detailed description of one or more embodiments of the utility meter with capacitor charging circuit has been presented herein by way of example only and not limitation. It will be recognized that there are advantages to certain individual features and functions described herein that may be obtained without incorporating other features and functions described herein. Moreover, it will be recognized that various alternatives, modifications, variations, or improvements of the above-disclosed embodiments and other features and functions, or alternatives thereof, may be desirably combined into many other different embodiments, systems or applications. Presently unforeseen or unanticipated alternatives, modifications, variations, or improvements therein may be subsequently made by those skilled in the art which are also intended to be encompassed by the appended claims. Therefore, the spirit and scope of any appended claims should not be limited to the description of the embodiments contained herein.

What is claimed is:

1. A utility meter comprising:
    a measurement circuit configured to provide consumption data;
    a memory configured to store the consumption data from the measurement circuit;
    a communications device configured to transmit the consumption data to a remote location;
    a power supply configured to supply an unregulated DC voltage and a regulated DC voltage, wherein the regulated DC voltage is output from a voltage regulator and is provided to the measurement circuit, and wherein the unregulated DC voltage is supplied to the communications device; and
    a capacitor charging circuit configured to connect a capacitor with the unregulated DC voltage responsive to the regulated DC voltage being provided to the capacitor charging circuit from the voltage regulator, thereby charging the capacitor.

2. The utility meter of claim 1 wherein the utility meter is an electricity meter, and wherein the measurement circuit is coupled to a power line and includes a current sensor and a voltage sensor.

3. The utility meter of claim 1 wherein the communications device includes a wireless transceiver configured to communicate with an automatic meter reading network.

4. The utility meter of claim 1 wherein the power supply includes an off-line switcher coupled to at least one power line, wherein the off-line switcher includes a rectifier and a transformer, and wherein the unregulated DC voltage is output from the off-line switcher.

5. The utility meter of claim 1 wherein the capacitor is a supercapacitor.

6. The utility meter of claim 5 wherein the capacitor charging circuit includes a transistor configured to switch between an on state and an off state, wherein the unregulated DC voltage charges the supercapacitor when the transistor is in the on state, and wherein the unregulated DC voltage does not charge the supercapacitor when the transistor is in the off state.

7. The utility meter of claim 6 wherein the transistor is switched to the on state when the regulated DC voltage is supplied to the supercapacitor charging circuit.

8. The utility meter of claim 7 wherein the supercapacitor is configured to charge in less than a minute after the transistor is switched to the on state.

9. The utility meter of claim 8 wherein the power supply further includes a first capacitor and a second capacitor charged from the unregulated DC voltage, wherein the first capacitor is configured to power the communications device and the second capacitor is configured to power the measurement circuit in the event of a power outage in a power line coupled to the utility meter.

10. The utility meter of claim 5 further comprising a real time clock, wherein the supercapacitor is configured to provide power to the real time clock.

11. The utility meter of claim 1 wherein the capacitor charging circuit is configured to disconnect the capacitor from the unregulated DC voltage responsive to the regulated DC voltage not being provided to the capacitor charging circuit from the voltage regulator, thereby blocking the capacitor from being charged.

12. The utility meter of claim 1 further comprising a transistor having a control terminal, a first terminal, and a second terminal, the control terminal operably connected to receive the regulated DC voltage from the voltage regulator, the first terminal operably connected to receive the unregulated DC voltage from the power supply, and the second terminal operably connected to the capacitor.

13. An electricity meter comprising:
    a measurement circuit configured to be coupled to a power line, the measurement circuit including a current sensor and a voltage sensor;
    a memory coupled to the measurement circuit, the memory configured to receive data from the measurement circuit;
    a power supply configured to be coupled to the power line and supply an unregulated DC voltage and a regulated DC voltage within the electricity meter, wherein the regulated DC voltage is output from a voltage regulator and is provided to the measurement circuit; and
    a capacitor charging circuit coupled to the voltage regulator, the capacitor charging circuit configured to connect a capacitor with the unregulated DC voltage responsive to the regulated DC voltage being provided to the capacitor charging circuit from the voltage regulator, thereby charging the capacitor.

14. The electricity meter of claim 13 wherein the capacitor charging circuit is configured to charge the capacitor when the regulated DC voltage is supplied by the voltage regulator, and wherein the capacitor charging circuit is configured to block the capacitor from being charged when the regulated DC voltage is not supplied by the voltage regulator.

15. The electricity meter of claim 14 wherein the capacitor charging circuit includes a transistor configured to be switched between an on state and an off state, wherein the capacitor is charged by the unregulated DC voltage when the transistor is in the on state, and wherein the capacitor is blocked from being charged when the transistor is in the off state.

16. The electricity meter of claim 13 wherein the capacitor is a supercapacitor.

17. The electricity meter of claim 16 wherein the capacitor charging circuit is configured to charge the supercapacitor in less than one minute.

18. The electricity meter of claim 16 further comprising a real time clock, wherein the supercapacitor is configured to provide power to the real time clock.

19. A method of charging a supercapacitor in an electricity meter comprising:

blocking the supercapacitor from charging before a voltage regulator reaches a minimum operating voltage, wherein voltage regulator is configured to supply a regulated DC voltage in the electricity meter; and charging the supercapacitor with an unregulated DC voltage after the voltage regulator reaches a minimum operating voltage.

20. The method of claim 19 further comprising powering a real time clock in the electricity meter with the supercapacitor.

* * * * *